US012764971B2

(12) United States Patent
Chang et al.

(10) Patent No.: US 12,764,971 B2
(45) Date of Patent: Oct. 13, 2026

(54) MAGNETO RESISTIVE RANDOM ACCESS MEMORY CIRCUIT AND LAYOUT

(71) Applicant: UNITED MICROELECTRONICS CORP., Hsin-Chu City (TW)

(72) Inventors: Ting-Hao Chang, Kaohsiung City (TW); Chien-Yu Ko, Tainan City (TW); Cheng-Tung Huang, Kaohsiung City (TW); Wen-Liang Huang, Taoyuan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 92 days.

(21) Appl. No.: 18/770,612

(22) Filed: Jul. 11, 2024

(65) Prior Publication Data

US 2025/0374554 A1 Dec. 4, 2025

(30) Foreign Application Priority Data

May 31, 2024 (TW) ................................ 113120281

(51) Int. Cl.
*G11C 11/16* (2006.01)
*H10B 61/00* (2023.01)

(52) U.S. Cl.
CPC ............ *H10B 61/22* (2023.02); *G11C 11/161* (2013.01); *G11C 11/1673* (2013.01); *G11C 11/1675* (2013.01)

(58) Field of Classification Search
CPC .............. G11C 11/161; G11C 11/1673; G11C 11/1675
See application file for complete search history.

(56) References Cited

U.S. PATENT DOCUMENTS

| | | | | |
|---|---|---|---|---|
| 9,275,714 | B1 | 3/2016 | Kim | |
| 2010/0008134 | A1* | 1/2010 | Chen | G11C 11/1675 365/171 |
| 2013/0028010 | A1 | 1/2013 | Li | |
| 2013/0258750 | A1* | 10/2013 | Kim | G11C 13/003 365/158 |
| 2013/0272059 | A1* | 10/2013 | Lin | G11C 29/74 365/158 |
| 2019/0206939 | A1* | 7/2019 | Bozdag | G11C 11/00 |

* cited by examiner

*Primary Examiner* — Amir Zarabian
*Assistant Examiner* — Anthony Thinh Tang
(74) *Attorney, Agent, or Firm* — Winston Hsu

(57) ABSTRACT

A MRAM circuit is provided in the present invention, wherein each memory cell includes a first transistor with a first gate, a first source and a first drain and the first gate is connected to a first word line, a second transistor with a second gate, a second source and a second drain and a second gate is connected to a second word line, and the second source and the second drain are connected respectively with the first source and the first drain, a first MTJ with one terminal connected to the first source and the second source and another terminal connected to a source line, and a second MTJ with one terminal connected to the first drain and the second drain and another terminal connected to a bit line.

8 Claims, 5 Drawing Sheets

MAGNETO RESISTIVE RANDOM ACCESS MEMORY CIRCUIT AND LAYOUT

BACKGROUND OF THE INVENTION

1. Field of the Invention

The present invention relates generally to a MRAM circuit and layout, and more specifically, to a 2T2M (two transistors and two memory devices) MRAM circuit with MTJs arranged at source terminals of transistors and layout thereof.

2. Description of the Prior Art

Magneto resistive random access memory (MRAM) is a kind of emerging memory highly-anticipated in recent years, with advantages comparable to all kinds of existing memory. For example, MRAM has an access speed comparable to SRAM, with non-volatility and low power consumption like Flash, and with high integrity and durability like DRAM. More importantly, the process of forming MRAM devices may be integrated in available semiconductor BEOL (back-end-of-line) processes. Thus, it has a potential to become primary memory used in semiconductor chips. The storage device of MRAM, ex. magnetic tunnel junctions (MTJs), is usually arranged in a layer level between a lower interconnect and an upper interconnect, cooperating with one or more transistors to control circuit switch during read/write operations. Unlike conventional memory using electric charges to store data, an external magnetic field is applied in the write operation of MRAM to control the polarization direction of MTJs and implement different tunnel magnetoresistances (TMR), so as to define different storage states for storing digital data.

In response to the miniaturization demand of various electronic produces nowadays, how to accommodate more memory cells in a limited layout area and scale memory cells for improving layout utilization has become an essential topic for those of skilled in the art to develop and research, in hope of applying MRAM more widely and maturely in memory field.

SUMMARY OF THE INVENTION

In the light of the aforementioned demands for miniaturizing memory cells and increasing memory capacity in unit layout area, the present invention hereby provides a novel MRAM circuit and relevant layout, with features of MTJs arranged at source terminals of transistors to implement multistate write and read operation in 2T2M MRAM circuit, increasing memory capacity in unit layout area. In addition, the circuit is further designed to reduce required write voltage, improving driving capability of the transistor.

One aspect of the present invention is to provide a MRAM circuit with multiple memory cells, wherein each memory cell includes: a first transistor with a first gate, a first source and a first drain, and the first gate is connected to a first word line; a second transistor with a second gate, a second source and a second drain, and the second gate is connected to a second word line, and the second source and second drain are connected respectively with the first source and first drain; a first MTJ with a first reference later connected to the first source and the second source and a first free layer connected to a source line; and a second MTJ with a second reference layer connected to the first drain and second drain and a second free layer connected to a bit line.

Another aspect of the present invention is to provide a MRAM layout with multiple memory cells, wherein each memory cell includes: a substrate with multiple active areas formed thereon; a first word line and a second word line spaced apart and extending over the active areas on the substrate, wherein the active area at outer side of the first word line is first active area, the active area between the first word line and the second world line is second active area, and the active area at outer side of the second word line is third active area; a first MTJ in BEOL metal layer, with one terminal connected to the first active area and another terminal connected to a source line; and a second MTJ in the BEOL metal layer, with one terminal connected to the second active area and another terminal connected to a bit line.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
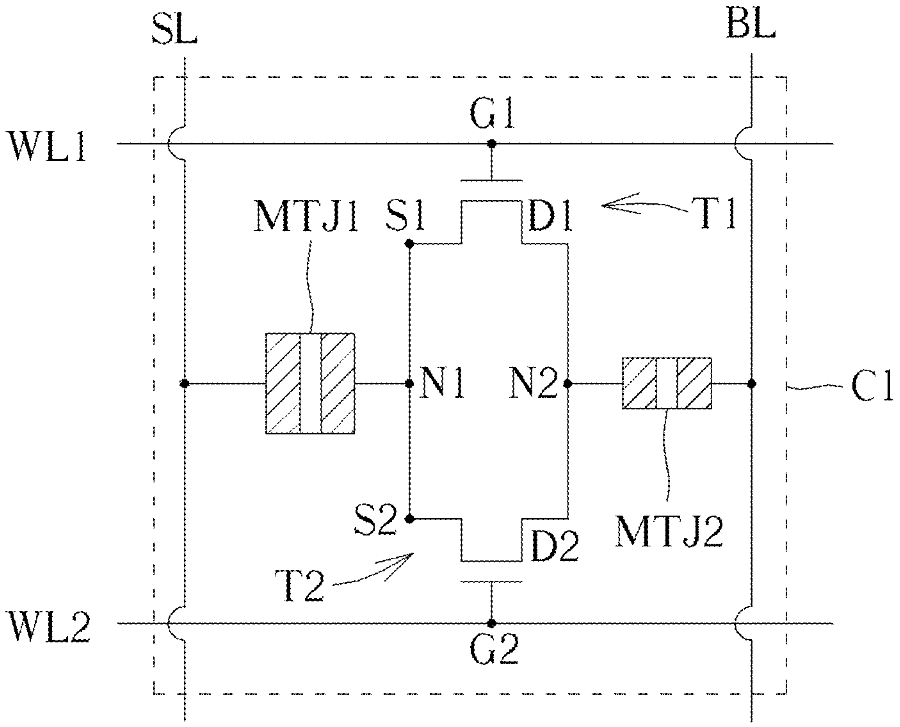
FIG. 1 is a circuit diagram of a MRAM in accordance with the preferred embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of “on,” “above,” and “over” in the present disclosure should be interpreted in the broadest manner such that “on” not only means “directly on” something but also includes the meaning of “on” something with an intermediate feature or a layer therebetween, and that “above” or “over” not only means the meaning of “above” or “over” something but can also include the meaning it is “above” or “over” something with no intermediate feature or layer therebetween (i.e., directly on something). In addition, spatially relative terms (e.g., “beneath,” “below,” “lower,” “above,” “upper” and the like) may be used herein for ease of description to describe one element or a relationship between a feature and another element or feature as illustrated in the figures.

As used herein, the term “substrate” refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

As used herein, the term “layer” refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term “one or more” as used herein, depending at least in part upon context, may be used to describe any feature, structure, or characteristic in a singular sense or may be used to describe combinations of features, structures or characteristics in a plural sense. Similarly, terms, such as “a,” “an,” or “the,” again, may be understood to convey a singular usage or to convey a plural usage, depending at least in part upon context. Additionally, the term “based on” may be understood as not necessarily intended to convey an exclusive set of factors, but may allow for the presence of other factors not necessarily expressly described, again depending at least in part on the context.

It will be further understood that the terms “includes,” “including,” “comprises,” and/or “comprising,” when used in this specification, specify the presence of stated features, integers, steps, operations, elements, and/or components, but do not preclude the presence or addition of one or more other features, integers, steps, operations, elements, components, and/or groups thereof.

Firstly, please refer to FIG. 1, which is a circuit diagram of a MRAM in accordance with the preferred embodiment of present invention. This embodiment takes 2T2M (two transistors and two memory devices) MRAM cell architecture as an example to describe components and the interconnection therebetween in the MRAM circuit of present invention. Although the memory cell shown in the embodiment is provided with two storage devices, please note that there might be more storage cells included in a memory cell in actual implementation. The scope of present invention is not limited thereto and should be defined by accompanying claims.

The MRAM circuit of present invention includes multiple memory cells, which may be arranged regularly on a layout plane in a cell array or block, and might share a number of word lines and bit lines. For the conciseness of specification, only one memory cell C1 is shown in the circuit of FIG. 1 as an example, and other memory cells in MRAM are considered as having identical or similar structure. As shown in FIG. 1, each memory cell C1 includes two transistors T1, T2 and two storage devices MTJ1, MTJ2 (i.e. magnetic tunnel junction, MTJs). In addition, each memory cell C1 is provided with one bit line BL, one source line SL and two word lines WL1, WL2. In the embodiment, the first transistor T1 and the second transistor T2 are connected in parallel connection, meaning their sources S1, S2 are connected with each other and their drains D1, D2 are connected with each other. In the aspect of circuit, the gates G1, G2 of first transistor T1 and second transistor T2 are connected respectively to the first word line WL1 and second word line WL2. Theses word lines are gates of corresponding transistors in actual structure.

Refer still to FIG. 1. In the embodiment, a junction of the sources S1, S2 of first transistor T1 and second transistor T2 is first node N1 (or referred as storage node), a junction of the drains D1, D2 of first transistor T1 and second transistor T2 is second node N2, and another terminals of the first node N1 and second node N2 are connected respectively to a source line SL and a bit line BL. More specifically, a first MTJ1 and a second MTJ2 are connected respectively on the first node N1 and second node N2. The two MTJs are components responsible for storing data in the MRAM of present invention. One terminal of the first MTJ1 is coupled to the first node N1 and another terminal of the first MTJ1 is coupled to the source line SL. One terminal of the second MTJ2 is coupled to the second node N2 and another terminal of the second MTJ2 is coupled to the bit line BL. Please note that the scheme of two MTJs shown in the figure is only an example. In other embodiment, each node may be provided with more than one MTJ in series connection in order to implement more storage states and increasing memory capacity in a given layout area.

Figure 2:
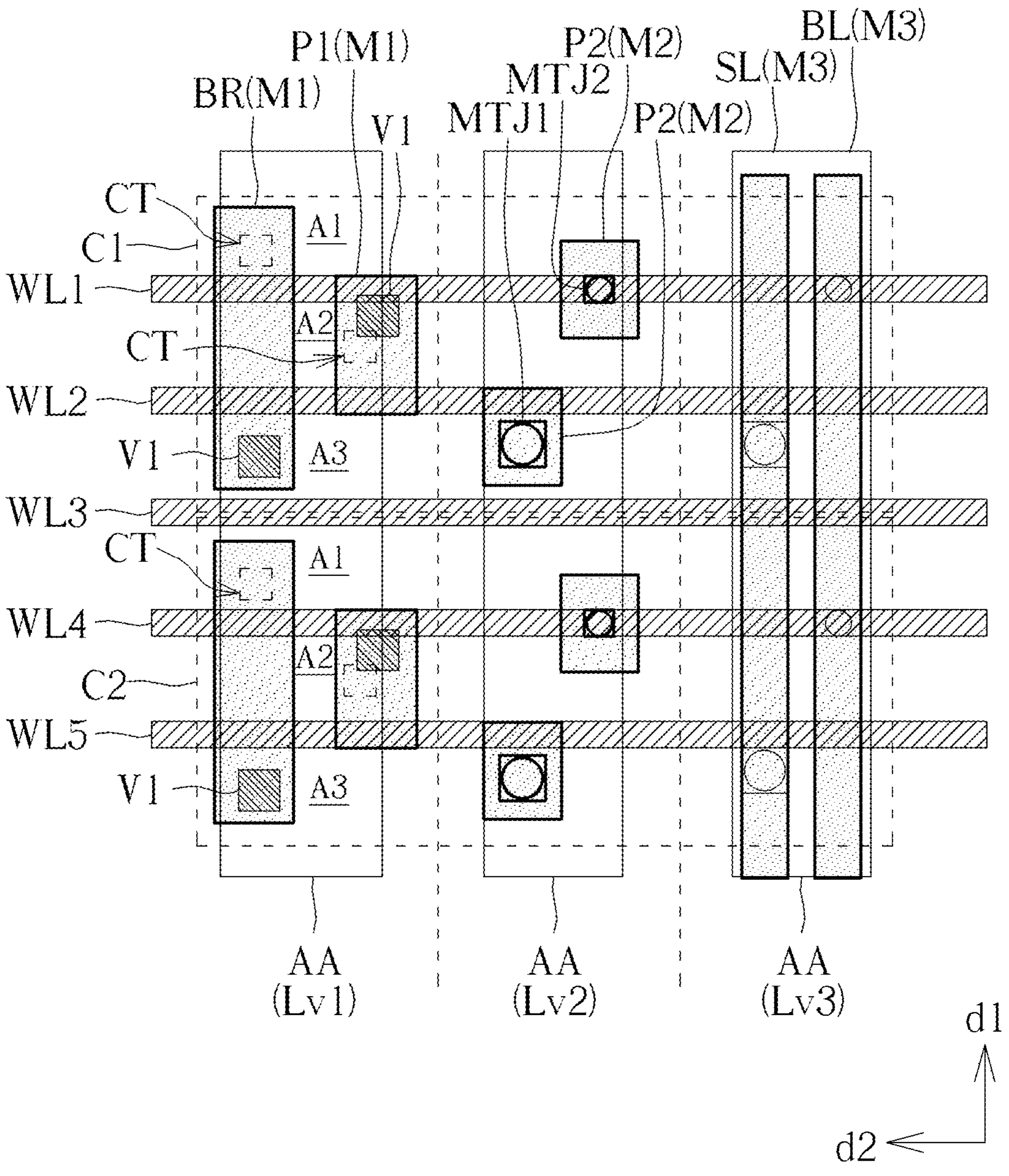
FIG. 2 is a layout of the MRAM in accordance with the preferred embodiment of present invention.
Figure 3:
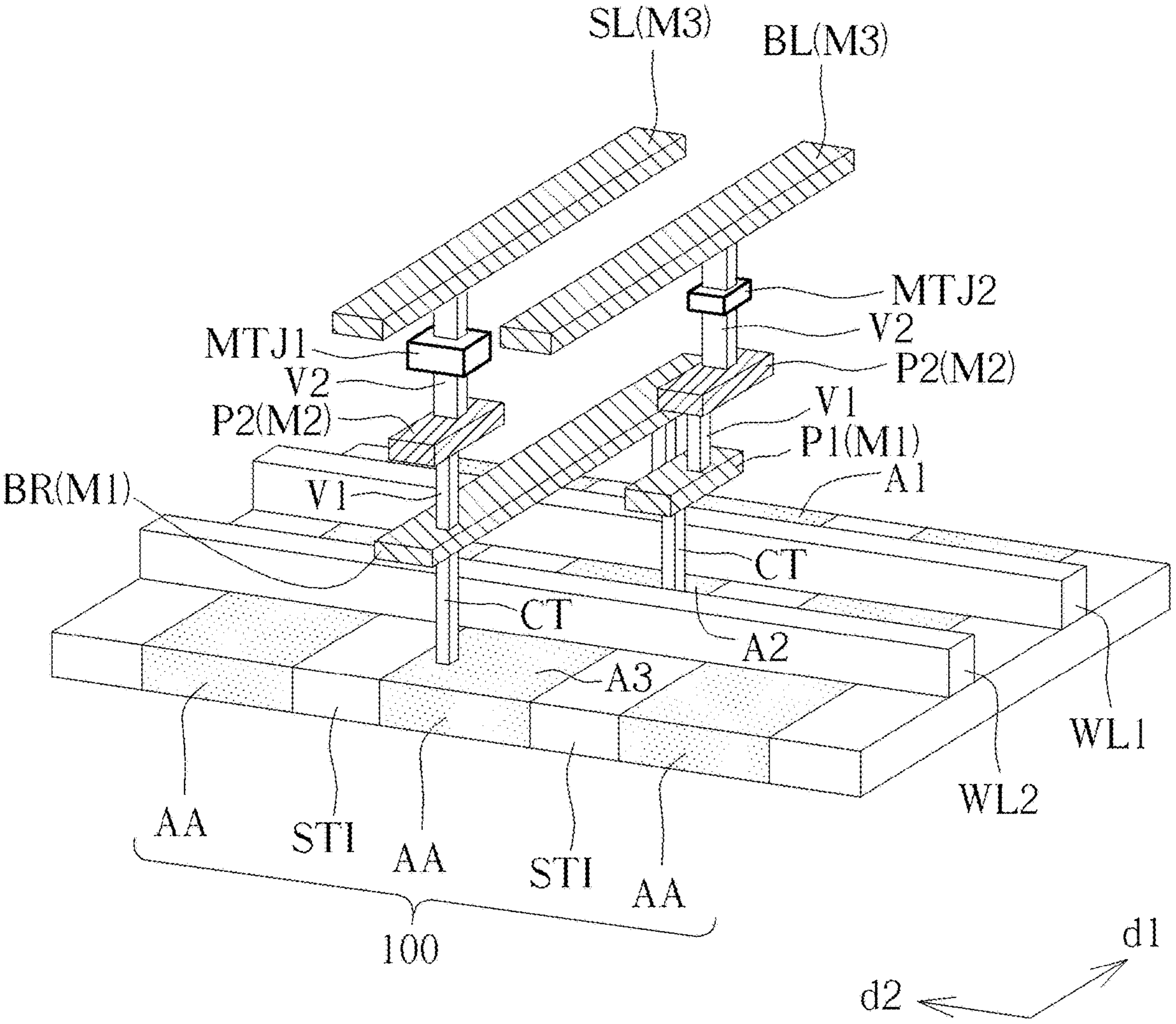
FIG. 3 is an isometric view of the MRAM in accordance with the preferred embodiment of present invention.

After describing the architecture of MRAM circuit of the present invention, please refer to FIG. 2 and FIG. 3 at the same time, which are a layout plane and an isometric view of the MRAM respectively in accordance with the preferred embodiment of present invention, for describing the overlapping patterns and interconnection of the components of MRAM in a vertical direction in actual layout plane of the present invention, in order to provide a better understanding of explicit structure of the MRAM in present invention for readers. Please note that the layout of FIG. 2 is presented in a way displaying multiple layers in single drawing simultaneously, wherein the layout is divided into three sections, including levels Lv1-Lv3. These three sections are completely overlapped with each other in a direction vertical to the substrate, and the active areas AA in the three levels are the same active area. Such presentation approach may provide a clear understanding for reader about the overlapping relation between component patterns of the MRAM of present invention in the vertical direction, and the isometric view of FIG. 3 further illustrates a 3D structure of single memory cell, which is stated herein in advance.

As shown in FIG. 2 and FIG. 3, the MRAM of present invention is set up on a semiconductor device 100. The substrate 100 may be a silicon substrate, multiple active areas AA with different conductivity may be formed therein beforehand through ion implantation process, and silicon oxide based shallow trench isolations (STIs) may be formed to isolate different active areas AA (only one active area shown in the figure). The active area AA extends in a horizontal first direction d1, with multiple word lines WL1-WL5 spaced apart thereon and extending over the active area AA in a horizontal second direction d2. The second direction d2 is preferably perpendicular to the first direction d1. In the embodiment of present invention, every two word lines are considered as a group to control the switch of transistors in every memory cell in a corresponding memory row. For example, the word lines WL1-WL2 are considered as a group to control the switch of transistors in memory cell C1, and the word lines WL4-WL5 are considered as a group to control the switch of transistors in memory cell C2.

Refer still to FIG. 2 and FIG. 3. The word lines WL1-WL5 divide the active area AA into multiple active subareas. As shown in the figure, the active area at outer side of the first word line WL1 is first active area A1, the active area between the first word line WL1 and the second word line WL2 is second active area A2, and the active area at outer side of the second word line WL2 (between the second word line WL2 and the third word line WL3) is third active area A3. In the embodiment of present invention, these active areas A1-A3 functions as sources/drains of transistors. Specifically, the first word line WL1 functions as a gate for the first transistor T1 (FIG. 1), with active areas A1, A2 at two sides functioning respectively as source and drain of the first transistor T1. The second word line WL2 functions as a gate for the second transistor T2 (FIG. 1), with active areas A2, A3 at two sides functioning respectively as source and drain of the second transistor T2. With respect to the third word line WL3, it functions as a dummy word line for dividing the memory cells (ex. C1 and C2, including the active area A1 and active area A3 therein) adjacent to each other in the first direction d1, without any BEOL (back-end-of-line) metal interconnects connected thereon and not involving in circuit operation. With this design, the first transistor T1 and second transistor T2 (FIG. 1) share the same active area A2 (meaning their drains are connected with each other in terms of circuits), while the active area A1 of first transistor T1 and the active area A3 of second transistor T2 are connected with each other through a bridge part BR (meaning their sources are connected with each other in terms of circuits).

Refer still to FIG. 2 and FIG. 3. In addition to the active area AA, component patterns in a first metal layer M1 above the active area AA is illustrated in level Lv1. In the embodiment of present invention, the patterns of first metal layer M1 include several bridge parts BR and several patterns P1. More specifically, each memory cell C1, C2 is provided with one bridge part BR and one pattern P1, wherein the bridge part BR of every memory cell extends over the word lines WL1, WL2 in the first direction d1 and overlaps the active area AA, and the active areas (ex. A1, A3) at outer sides of the memory cell are connected respectively to the bridge part BR through contacts CT, which is exactly the position of first node N1 in the circuit of FIG. 1. Each bridge part BR is further connected to pattern P2 of a second metal layer M2 and a storage device above through a via V1. The position of via V1 is preferably above the active area A1 or A3 to optimize layout utilization. On the other hand, the active area A2 inside the memory cell is also connected to a corresponding pattern P1 of the first metal layer M1 above through a contact CT, which is exactly the position of second node N2 in the circuit of FIG. 1. Each pattern P1 is further connected to a pattern P2 of second metal layer M2 and a storage device above through another via V1. With this design, an additional MTJ device may be arranged above each source terminal (ex. active areas A1, A3) on every active area AA, which may significantly increase memory capacity in comparison to the conventional skill that arranging only one MTJ storage device at drain terminal, reducing layout area required by every memory cell.

Refer still to FIG. 2 and FIG. 3. Component patterns P2 in the second metal layer M2 above the first metal layer M1 and MTJ1, MTJ2 in the MRAM structure are illustrated in level Lv2. In the level Lv2, each pattern P2 follows the circuit connected from one active area (ex. A1-A3) of the memory cell through via V1, and each pattern P2 is further connected to the MTJ1, MTJ2 and circuits like bit line/source line set up above through via V2. In the embodiment of present invention, MTJ1, MTJ2 function as storage devices in the MRAM, which are preferably arranged in the BEOL interconnects and might be compatible and integrated in CMOS process nowadays. For example, as shown in the figure, the MTJ1, MTJ2 are preferably set up in the level of via V2 between the second metal layer M2 and the third metal layer M3 (may be inserted in via V2). More specifically, the first MTJ1 in one memory cell may overlap the contact CT below in the vertical direction (may also overlap the via V1), which is positioned on the active areas A1 or A3 at outer sides of the memory cell (ex. source terminals). On the other hand, the second MTJ2 in one memory cell may overlap one of the word lines WL1, WL2 below in the vertical direction (may also overlap the via V1), which is positioned on the active areas A1 or A3 at outer sides of the memory cell (ex. source terminals). On the other hand, the second MTJ2 in one memory cell may overlap one of the word lines WL1, WL2 below in the vertical direction and may be set up on a position shifting to the side close to the bit line BL in the second direction d2, so that the two MTJ1, MTJ2 may then be connected respectively and vertically to the source SL and bit lines BL above (i.e. defining the positions of two storage nodes in one memory cell on the layout plane).

Refer still to FIG. 2 and FIG. 3. In the preferred embodiment of present invention, there are only patterns of source line SL and bit line BL in level Lv3, which are parts of the third metal layer M3. The source line SL and bit line BL extend over multiple word lines WL1-WL5 in the first direction d1 and overlap the active area AA, wherein the source line SL substantially overlap the MTJ1 (i.e. first node N1) and bridge part BR below, and the bit line BL substantially overlap the MTJ2 (i.e. second node N2) and the pattern P1 below. With this design, in the embodiment of present invention, the source line SL and bit line BL are shared by every memory cell (ex. C1, C2) in a corresponding column. For example, the MTJ1 in memory cell C1 and memory cell C2 are connected to the source line SL through respective vias V2, and the second MTJ2 in memory cell C1 and memory cell C2 are connected to the bit line BL through respective vias V2.

Figure 4:
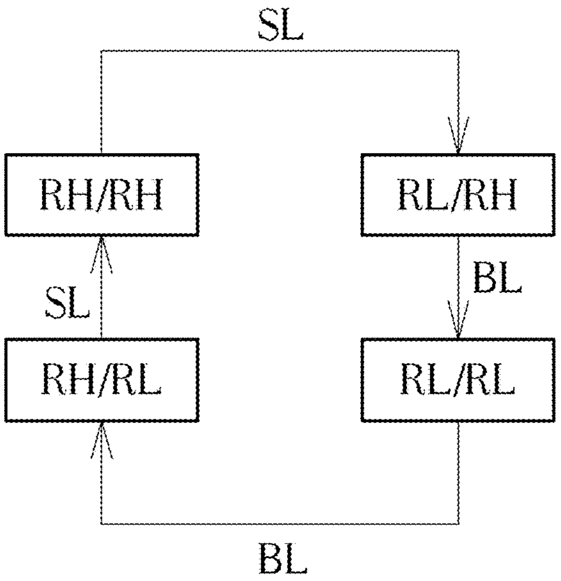
FIG. 4 is a schematic diagram illustrating the transition relation between different storage states in write operations of the MRAM in accordance with the preferred embodiment of present invention.
Figure 5:
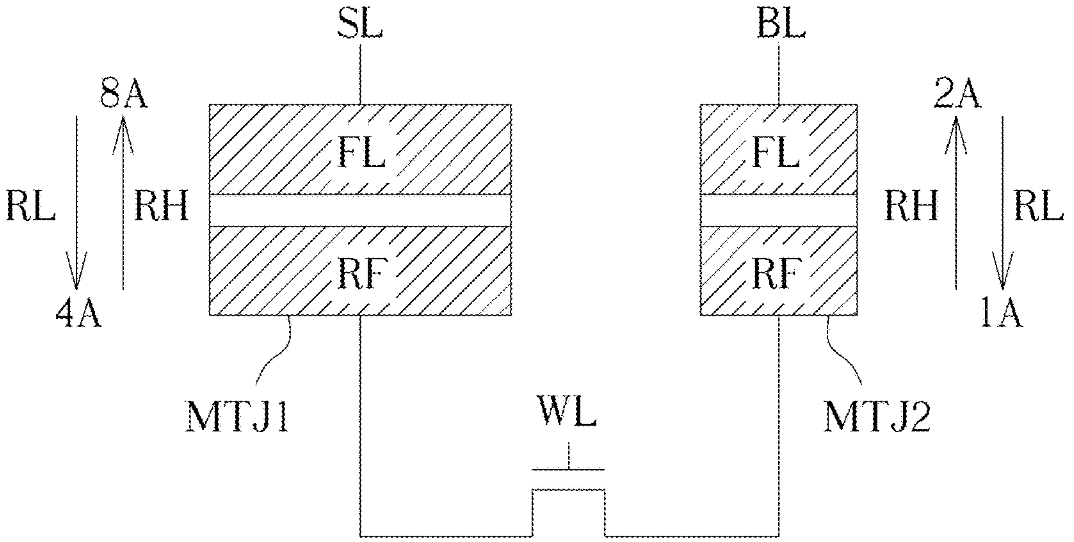
FIG. 5 is a schematic diagram illustrating write voltages, source line and bit line used for corresponding MTJs in the write operation of MRAM in accordance with the preferred embodiment of present invention.

After the aforementioned layout and vertical interconnection of MRAM in the present invention is described, several write operations of the aforementioned MRAM will be described with reference to FIG. 4 and FIG. 5, wherein FIG. 4 is a schematic diagram illustrating the transition relation between different storage states in the write operations of MRAM in accordance with the preferred embodiment of present invention, and FIG. 5 is a schematic diagram illustrating write voltages, source line and bit line used for corresponding MTJs in the aforementioned write operation of MRAM, in order to provide a better understanding of the operation mechanism of the MRAM structure for readers.

In the embodiment of present invention, the MTJ1, MTJ2 in the same memory cell will be provided designedly with different threshold currents. The so-call threshold current is defined as a current capable of rendering the storage state of MTJ into required storage state when an applied current is larger than the threshold current. Specifically, as shown in FIG. 5, the MTJ1 has a predetermined first high-level (RH) threshold current and a predetermined first low-level (RL) threshold current. When an applied current is larger than the first RH threshold current, the MTJ1 is changed into RH state, and when the applied current is a reverse current and larger than the first RL threshold current, the MTJ1 is changed into RL state. Similarly, the MTJ2 has a predetermined second high-level (RH) threshold current and a predetermined second low-level (RL) threshold current. When an applied current is larger than the second RH threshold current, the MTJ2 is changed into RH state, and when the applied current is a reverse current and larger than the second RL threshold current, the MTJ2 is changed into RL state.

In the embodiment, the first RH threshold current of MTJ1 (ex. 8 A) is designedly larger than the first RL threshold current (ex. 4 A), and further larger than the second RH threshold current of MTJ2 (ex. 2 A), and further larger than the second RL threshold current (ex. 1 A). In principle, the threshold current of MTJ1 would be larger than the threshold current of MTJ2. However, in other embodiment, it might be the MTJ2 having larger threshold current, but not limited thereto.

Furthermore, in the embodiment of present invention, take MRAM in spin-transfer torque (STT) architecture as an example, each MTJ may include a free layer FL, a reference layer RF (or referred as pinned layer) and an insulating layer therebetween. The write principle of STT-MTJ is to spin the magnetic moment in the ferromagnetic layer of MTJ. For example, when the free layer FL and reference layer RF in a MTJ have the same polarization direction, the resistance of MTJ is smaller, which may be defined as being in "O" storage state, namely RL state. On the other hand, when the free layer FL and reference layer RF in a MTJ have opposite polarization directions, the resistance of MTJ is larger, which may be defined as being in "1" storage state, namely RH state. The read mechanism of STT-MTJ is applying small current for measuring the resistance of target MTJ and obtaining its storage state, thereby implementing binary storage mode.

Following the aforementioned mechanism of level states, please note that in the embodiment of present invention, the MTJ1 is connected to a source line SL above, while the MTJ2 is connected to a bit line BL above, and both of them are connected to the corresponding source line SL or bit line BL with their free layers FL in the MTJs. With respect to the MTJ1 in this arrangement, the write current applied from the source line SL will spin the polarization direction of free layer FL to a direction the same as the one of reference layer RF, rendering it in low-resistance level (RL) state, while the write current applied from the bit line BL will spin the polarization direction of free layer FL to a direction opposite to the one of reference layer RF, rendering it in high-resistance level (RH) state. On the other hand, with respect to the MTJ2 in this arrangement, the write current applied from the source line SL will spin the polarization direction of free layer FL to a direction opposite to the one of reference layer RF, rendering it in high-resistance level (RH) state, while the write current applied from the bit line BL will spin the polarization direction of free layer FL to a direction the same as the one of reference layer RF, rendering it in low-resistance level (RL) state.

Refer still to FIG. 4. The write operation of present invention is designed with two schemes: applying write current from bit line and applying write current from source line, and different states may transition in order through two schemes. For example, when the MTJ1/MTJ2 are in RH/RH state, applying a specific current from the source line SL (as shown by arrow) may change the MTJ1/MTJ2 into RL/RH state. Detailed write operations of different storage states will be described as following:

Firstly, as shown in FIG. 5, in an operation of writing the MTJ1/MTJ2 as RL/RH state, the MTJ1/MTJ2 may be rendered in RH/RH state first. Thereafter, since the MTJ1 is the one to be transitioned from RH to RL state at this time, the write current $I_C$ should be applied from the source line SL, and it should be at least larger than the first low-level threshold current of the MTJ1, i.e. $I_C$>4 A, so that the MTJ1 will be written as low-level state (RL). With respect to the MTJ2, the write current $I_C$ is applied from the reference layer RF to the free layer FL, which is a current direction writing the MTJ2 as RH state. Although the write current $I_C$ is larger than the second high-level threshold current of MTJ2 ($I_C$>4 A>2 A) in this case, it will not change the storage state of MTJ2 since the MTJ2 is already in RH state. In addition, the word line plays a role for controlling the switch of current channel during read/write operation.

In another write operation of writing the MTJ1/MTJ2 as RL/RL state, the MTJ1/MTJ2 may be rendered in the aforementioned RL/RH state first. Thereafter, since it is the MTJ2 to be transitioned from RH to RL state at this time, the write current $I_C$ should be applied from bit line BL, and it should be at least larger than the second low-level threshold current of the MTJ2, i.e. $I_C$>1 A. Furthermore, in order to prevent excessive write current $I_C$ from writing the MTJ1 from RL state into RH state, the write current $I_C$ should be smaller than the first high-level threshold current of MTJ1, i.e. 8 A>$I_C$>1 A.

In still another write operation of writing the MTJ1/MTJ2 as RH/RL state, the MTJ1/MTJ2 may be rendered in the aforementioned RL/RL state first. Thereafter, since it is the MTJ1 to be transitioned from RL to RH state at this time, the write current $I_C$ should be applied from bit line BL, and it should be at least larger than the first high-level threshold current of MTJ1, i.e. $I_C$>8 A. With respect to the MTJ2, the write current $I_C$ is applied from free layer FL to reference layer RF, which is a current direction writing the MTJ2 as RL state. Although the write current $I_C$ is larger than the second low-level threshold current of MTJ2 ($I_C$>8 A>1 A), it will not change the level state of MTJ2 since the MTJ2 is already in RL state.

In still another write operation of writing the MTJ1/MTJ2 as RH/RH state, the MTJ1/MTJ2 may be rendered in the aforementioned RH/RL state first. Thereafter, since it is the MTJ2 to be transitioned from RL to RH state at this time, the write current $I_C$ should be applied from source line SL, and it should be at least larger than the second high-level threshold current of MTJ2, i.e. $I_C$>2 A. Furthermore, in order to prevent excessive write current $I_C$ from writing the MTJ1 from RH state into RL state, the write current $I_C$ should be smaller than the first low-level threshold current of MTJ1, i.e. 4 A>$I_C$>2 A.

The embodiment above describes explicit, detailed write operations of the MRAM of present invention, it may be understood that under the operation of this architecture, each memory cell may have $2^N$ storage states, depending on the number N of MTJs provided therein. For example, in the preferred embodiment, each memory cell is provided with two MTJs, which may implement fourth different storage states RL/RL, RL/RH, RH/RH and RH/RL. A read mechanism of these storage states will be described with reference to FIG. 6 in following embodiment.

Figure 6:
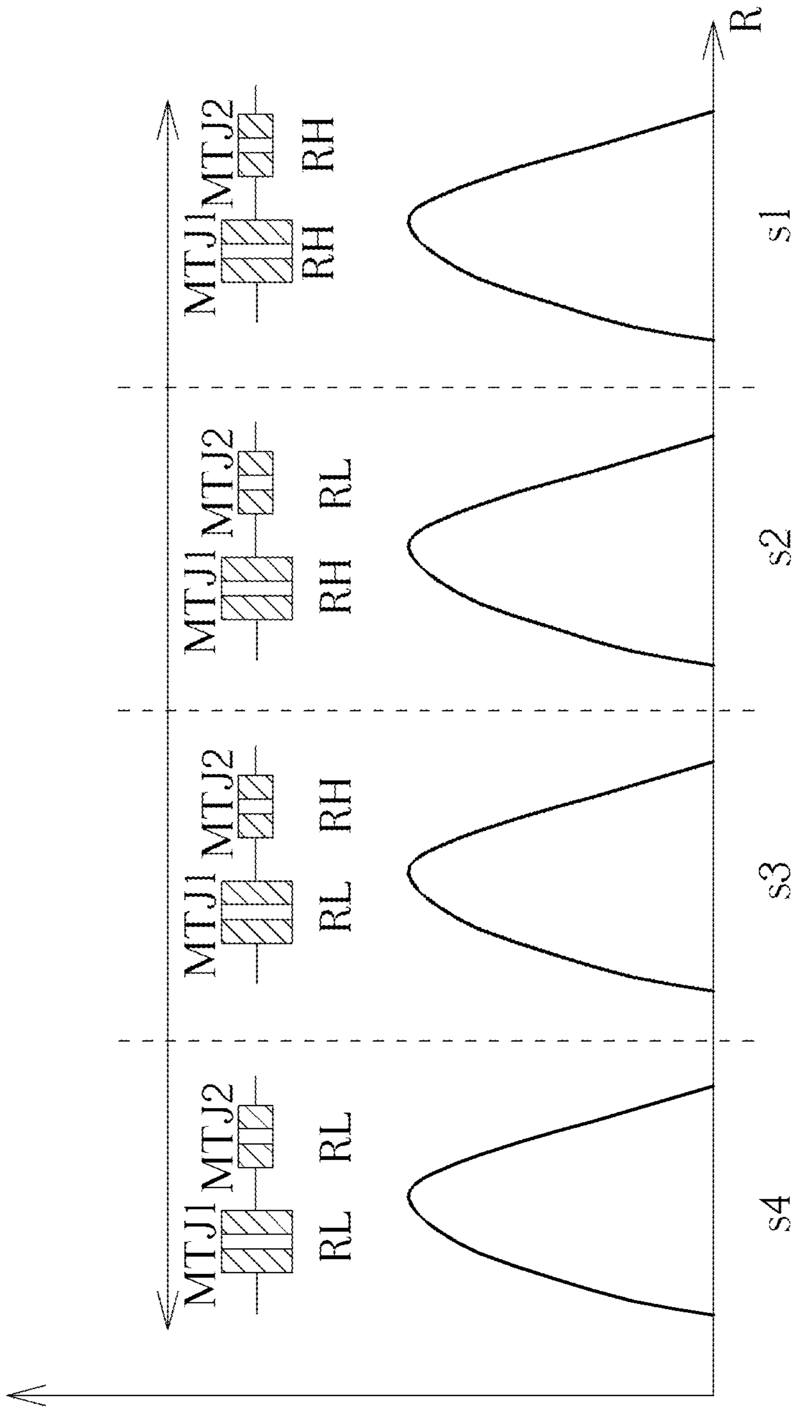
FIG. 6 is a schematic graph illustrating a read operation of the MRAM in accordance with the preferred embodiment of present invention.

As shown in FIG. 6, which is a schematic graph illustrating the read operation of MRAM in accordance with the preferred embodiment of present invention, wherein x-axis in the graph represents resistance R and y-axis in the graph represents the distribution of resistance R. This graph may be used in the read operation of MRAM to determine the storage state of a MRAM cell through applying small current for measuring the resistance R of MTJ. With respect to the aforementioned MTJs with four different storage states RL/RL, RL/RH, RH/RH and RH/RL, the resistance measured from a MRAM cell may be located in four distinct resistance intervals s1-s4, Among them, a measured resistance locating in the interval s1 represents the MTJ1/MTJ2 are both in high-level state (RH/RH), a measured resistance locating in the interval s2 represents the larger MTJ1 and smaller MTJ2 in the two MTJs are respectively in high-level state and low-level state (RH/RL), a measured resistance locating in the interval s3 represents the larger MTJ1 and smaller MTJ2 in the two MTJs are respectively in low-level state and high-level state (RL/RH), and a measured resistance locating in the interval s4 represents the MTJ1 and MTJ2 in the two MTJs are both in low-level state (RL/RL). The storage state of every MTJ may be precisely read in this way. Please note that, since the present invention adopts a MRAM architecture having source terminal and drain terminal connected respectively with one MTJ, the required write voltage may be smaller, so as to improve read/write capability of the MRAM.

It may be understood from the aforementioned embodiments that the present invention features a design of setting MTJs at source terminals of the transistors, cooperating with specially-designed write/read mechanisms to implement multistate write/read operations, improve memory capacity in unit layout area, and may be compatible and integrated in CMOS process nowadays and reduce require write voltage, which is the advantage and non-obviousness of present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A MRAM circuit with multiple memory cells, wherein each of said memory cells comprises:

a first transistor, comprising a first gate, a first source and a first drain, and said first gate is connected to a first word line;

a second transistor, comprising a second gate, a second source and a second drain, and said second gate is connected to a second word line and said second source and said second drain are connected respectively with said first source and said first drain;

a first MTJ, with a first reference layer connected to said first source and said second source and a first free layer connected to a source line; and a second MTJ, with a second reference layer connected to said first drain and said second drain and a second free layer connected to a bit line.

2. The MRAM circuit of claim 1, wherein said first MTJ is provided with a predetermined first high-level threshold current and a first low-level threshold current, said second MTJ is provided with a predetermined second high-level threshold current and a second low-level threshold current, and said first high-level threshold current is larger than said first low-level threshold current and further larger than said second high-level threshold current and further larger than said second low-level threshold current.

3. The MRAM circuit of claim 2, wherein applying a voltage from said bit line is to write said second MTJ as low-level state and write said first MTJ as high-level state, and applying a voltage from said source line is to write said first MTJ as low-level state and write said second MTJ as high-level state.

4. The MRAM circuit of claim 3, wherein a write operation of writing said first MTJ/said second MTJ respectively as low/high level state comprises:

rendering said first MTJ/said second MTJ respectively in high/high level state first; and applying a current larger than said first low-level threshold current from said source line.

5. The MRAM circuit of claim 3, wherein a write operation of writing said first MTJ/said second MTJ respectively as low/low level state comprises:

rendering said first MTJ/said second MTJ respectively in low/high level state first; and applying a current between said second low-level threshold current and said first high-level threshold current from said bit line.

6. The MRAM circuit of claim 3, wherein a write operation of writing said first MTJ/said second MTJ respectively as high/low level state comprises:

rendering said first MTJ/said second MTJ respectively in low/low level state first; and applying a current larger than said first high-level threshold current from said bit line.

7. The MRAM circuit of claim 3, wherein a write operation of writing said first MTJ/said second MTJ respectively as high/high level state comprises:

rendering said first MTJ/said second MTJ respectively in high/low level state first; and applying a current between said second high-level threshold current and said first low-level threshold current from said source line.

8. The MRAM circuit of claim 3, wherein four predetermined and individual resistance intervals comprising a first resistance interval, a second resistance interval, a third resistance interval and a fourth resistance interval are provided in a read operation of said first MTJ and said second MTJ, and said first resistance interval is higher than said second resistance interval and further higher than said third resistance interval and further higher than said fourth resistance interval, and said first MTJ and said second MTJ are determined both in high-level state when a read resistance is in said first resistance interval, and said first MTJ are determined in high-level state and said second MTJ are determined in low-level state when a read resistance is in said second resistance interval, and said first MTJ are determined in low-level state and said second MTJ are determined in high-level state when a read resistance is in said third resistance interval, and said first MTJ and said second MTJ are determined both in low-level state when a read resistance is in said fourth resistance interval.

* * * * *